(12) United States Patent
Haraguchi

(10) Patent No.: US 7,403,037 B2
(45) Date of Patent: Jul. 22, 2008

(54) SIGNAL AMPLIFIER

(75) Inventor: Yoshizumi Haraguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 159 days.

(21) Appl. No.: 11/117,338

(22) Filed: Apr. 29, 2005

(65) Prior Publication Data
US 2005/0242839 A1 Nov. 3, 2005

(30) Foreign Application Priority Data
Apr. 30, 2004 (JP) ............................. 2004-135413

(51) Int. Cl.
*H03K 19/0175* (2006.01)
(52) U.S. Cl. ...................... 326/83; 326/81; 326/68; 327/333
(58) Field of Classification Search ................ 326/81, 326/68, 83, 80; 327/333
See application file for complete search history.

(56) References Cited

U.S. PATENT DOCUMENTS

| | | | | | |
|---|---|---|---|---|---|
| 5,587,674 | A | * | 12/1996 | Danstrom | 327/67 |
| 5,751,167 | A | * | 5/1998 | Karube | 326/73 |
| 5,801,553 | A | * | 9/1998 | Danstrom | 327/67 |
| 5,828,242 | A | * | 10/1998 | Danstrom | 327/67 |
| 5,900,745 | A | * | 5/1999 | Takahashi | 326/64 |

FOREIGN PATENT DOCUMENTS

| | | |
|---|---|---|
| JP | 60-254904 | 12/1985 |
| JP | 2001-211393 | 8/2001 |
| JP | 2003-17959 | 1/2003 |

* cited by examiner

*Primary Examiner*—Vibol Tan
(74) *Attorney, Agent, or Firm*—Young & Thompson

(57) ABSTRACT

The signal amplifier has a source follower receiving an input signal, a voltage divider generating a bias voltage which is input to the source follower through a different path from the input signal, and an inverter connected in series in the subsequent stage of the source follower and having such characteristics as to compensate characteristics variation of the voltage divider due to manufacturing parameter.

10 Claims, 8 Drawing Sheets

SIGNAL AMPLIFIER

BACKGROUND OF THE INVENTION

1. Field of the Invention

The present invention relates to signal amplifiers and, particularly, to a signal amplifier having a noninverting amplifier and an inverting amplifier connected in series.

2. Description of Related Art

A voltage amplifier where a source follower and an inverter, which is typically an n-channel metal-oxide semiconductor (NMOS), are connected in series is used to amplify a micro charge detection signal in a charge-coupled device (CCD) or the like. The voltage amplifier, however, has a larger signal delay than a buffer or the like where a plurality of source followers are connected in series, which is used when not amplifying the voltage, and it is therefore not compatible with high-speed signals with a high frequency band. As a decrease in a CCD imaging time is required recently, a demand for a voltage amplifier with high speed and high voltage signal gain is increasing.

The configuration of a conventional voltage amplifier is described hereafter with reference to FIG. 6. This voltage amplifier has a clamp capacitor C1, inverters 2 and 3, and a clamp circuit 6, which are connected between a signal input terminal 11 and a signal output terminal 12. A power supply voltage VDD is supplied to each device.

One end of the clamp capacitor C1 is connected to the signal input terminal 11 and the other end is connected to a node N5. The node N5 is an input terminal of the inverter 2. The clamp capacitor C1 blocks the DC path between the signal input terminal 11 and the node N5 and transmits to the node N5 the AC component of an input signal Vin from the signal input terminal 11.

The inverter 2 has NMOS transistors M3 and M4. The transistor M3 has the drain and the gate connected to the power supply VDD and the source connected to the node N2. The transistor M4 has the drain connected to the node N2, the gate connected to the node N5, and the source connected to the ground GND. In the inverter 2, the transistor M4 is a drive transistor and the transistor M3 is a load transistor. The inverter 2 inverts and amplifies the voltage signal from the node N5 and outputs it to the node N2, which is the input terminal of the inverter 3 in the subsequent stage.

The inverter 3 has transistors M5 and M6. The transistor M5 has the drain and the gate connected to the power supply VDD and the source connected to the signal output terminal 12. The transistor M6 has the drain connected to the signal output terminal 12, the gate connected to the node N2, and the source connected to the ground voltage GND. In the inverter 3, the transistor M6 is a drive transistor and the transistor M5 is a load transistor. The inverter 3 inverts and amplifies the voltage signal output from the inverter 2 and outputs an output signal Vout to the signal output terminal 12.

The drive transistor M6 of the inverter 3 has a higher threshold voltage than the drive transistor M4 of the inverter 2. The transistors M3 and M5 have the same threshold voltage as the transistor M4.

The clamp circuit 6 has transistors M12 to M15. The transistors M12 and M14 each have the drain and the gate connected to the power supply VDD, and the source connected to the node N6. The transistor M13, which constitutes a voltage divider, has the drain and the gate connected to the node N6 and the source connected to the ground GND. The output terminal or the voltage dividing terminal of the voltage divider is the node N6. The transistor M15 has one of the source and the drain connected to the node N5, the other one of the source and the drain connected to the node N6, and the gate connected to the clamp control terminal 13.

The clamp circuit 6 determines the input offset voltage of the inverter 2, which is the voltage at the node N5. The transistor M15 is a clamp switching transistor and it is turned on or off by a control signal φCLP from the clamp control terminal 13. The transistor M14 has the same threshold voltage as the transistor M6 of the inverter 3. The transistors M12 and M13 have the same threshold voltage as the transistor M4 of the inverter 2. The transistor M15 may have any threshold voltage as long as it is capable of switching operation.

The clamp operation of the clamp circuit 6 is described below. The input signal Vin from the signal input terminal 11 is AC-coupled by the clamp capacitor C1 and input to the inverter 2. Further, the ON signal is input from the clamp control terminal 13 to turn on the clamp switching transistor M15, and the voltage V5 of the node N5, which is the input terminal of the inverter 2, thereby becomes equal to the voltage V6 of the node N6, which is the output terminal of the voltage divider. However, since the voltage V5 is fixed to a constant level in this state, the AC component of the voltage signal input to the signal input terminal 11 is not input to the inverter 2. Thus, upon input of the signal, the control signal φCLP is OFF to turn off the clamp switching transistor M15, and the voltage V5 varies according to the voltage of the input signal Vin with the offset voltage kept the same as the voltage V6.

The amplifying operation of the inverters 2 and 3 is described hereafter with reference to FIG. 7. FIG. 7 shows the input and output characteristics of the inverters 2 and 3. In the graph of FIG. 7, the horizontal axis indicates an input voltage and the vertical axis indicates an output voltage. The dotted line 701 and the solid line 702 show the characteristics of the inverter 2 and the inverter 3, respectively. The input voltage of the inverter 2 is the voltage V5 at the node N5, and the output voltage of the inverter 2 is the voltage V2 at the node N2. The input voltage of the inverter 3 is the voltage V2 at the node N2, and the output voltage of the inverter 3 is the voltage Vout at the signal output terminal 12. The region which has a constant gain for the input voltage and outputs an output voltage is called an amplification region.

If the threshold voltages of the transistors M4 and M6 are Vt1 and Vt2, respectively, the transistors M4 and M6 are not turned on and thus the inverters 2 and 3 do not perform inversion and amplification until the input voltages V5 and V2 of the inverters 2 and 3 reach the voltage levels Vt1 and Vt2, respectively. When the input voltages V5 and V2 exceed the voltage levels Vt1 and Vt2, the inverters 2 and 3 perform inversion and amplification. Thus, the region where the voltage exceeding the threshold voltage of each drive transistor is input is the amplification region of the inverter.

However, if the input voltages exceed the voltage levels Vd1 and Vd2 of FIG. 7, the inversion and amplification are stopped since the transistors M4 and M6 enter the triode region, and therefore the output voltages V2 and Vout become constant. As in FIG. 7, when the threshold voltages of the drive transistor are high and low, if the input offset voltage is the same, the output offset voltage is higher where the threshold voltage is higher; on the other hand, if the input offset voltage is higher for the higher threshold voltage, the output offset voltage is the same where the threshold voltages are high and low.

Referring next to FIG. 8, the operation when the inverters 2 and 3 are connected in series is described. FIG. 8 shows the input and output characteristics of the inverters 2 and 3 which are connected in series as in the configuration of FIG. 6. In the graph of FIG. 8, the first quadrant and the second quadrant show the input and output characteristics of the inverter 2 and the inverter 3, respectively. In the second quadrant, the dotted line 801 and the solid line 802 show the input and the output characteristics when the threshold voltage of the driver transistor M6 is Vt1 and Vt2, respectively.

A clamp voltage VC1 is applied so as to be the center of the amplification region. The input voltage V5 superposed with a clamp offset voltage VC5 is amplified and the output voltage V2 is transmitted to the inverter 3. If the threshold voltage of the drive transistor M6 of the inverter 3 is Vt1 shown by the dotted line 801, which is the same as the threshold voltage of the transistor M4 of the inverter 2, part or entire input signal may exceed Vd1. In this case, the part of the signal exceeding the amplification region is not amplified, such as the signal with the offset level VCout2 shown by the dotted line 803 in the second quadrant, and the input signal is not properly amplified. If, on the other hand, the threshold voltage of the drive transistor M6 of the inverter 3 is set to Vt2 as shown by the solid line 802, it is possible to set the entire input signal to be within the amplification region. In this case, the input signal is properly amplified, such as the signal with the offset level VCout shown by the solid line 804 in the second quadrant, to generate the output signal Vout.

When forming the circuit of FIG. 6 in an actual semiconductor device, the threshold voltage of the transistor may vary by manufacturing parameter variation such as uneven amount of ion implantation. In the circuit configuration of FIG. 6, only the transistor M14 of the clamp circuit 6 and the transistor M6 of the inverter 3 are the transistors having the same threshold voltage. Thus, even if the threshold voltage variation such as shown by the solid line 702 and the dotted line 701 of FIG. 7 occurs in the inverter 3, for example, and the input offset voltage varies according to the characteristics variation, the voltage is always about the center of the amplification region of the inverter 3.

Conventional voltage amplifiers are described in Japanese Unexamined Patent Application Publication No. 2001-211393, 2003-017959, and 60-254904, for example.

However, the present invention has recognized that the above conventional voltage amplifies require the clamp circuit 6 and the clamp control signal ϕCLP for adjusting the input offset voltage, which causes the drive circuit of the device to be more complicated.

Further, since the conventional voltage amplifiers use the clamp circuit 6, it requires the clamp capacitor C1 for AC-coupling or DC-cutting the signal input terminal 11 and the node N5 of the input terminal of the inverter 2. Parasitic impedance such as the capacitance of the capacitor C1 and the line resistance thereby increases, which results in higher input capacitance of the voltage amplifier of FIG. 6. In the voltage amplifier having the circuit of FIG. 6, this reduces the speed (used frequency band) of the entire voltage amplifier due to a time constant increase in a charge and discharge time of the circuit in the previous stage of the clamp, such as a source follower.

Furthermore, the DC-cutting in the clamp capacitor causes the amplitude or gain of the input signal Vin to decrease in the node N5. This is because the voltage signal is divided by the parasitic capacitance of the capacitor C1 and the node N5, such as line capacitance of the node N2, gate capacitance of the transistor M4, gate-drain capacitance, gate-source capacitance, diffusion layer capacitance in the drain or the source of the transistor M15, and diffusion layer-gate capacitance. This impedes achievement of higher gain and higher speed operation particularly in voltage amplifiers.

SUMMARY OF THE INVENTION

According to one aspect of the present invention, there is provided a signal amplifier for amplifying an input signal, comprising a noninverting amplifier receiving an input signal; a bias voltage generator generating a bias voltage which is input to the noninverting amplifier through a different path from the input signal and regulates an output offset voltage of the noninverting amplifier; and an inverting amplifier connected in series in a subsequent stage of the noninverting amplifier and having such characteristics as to compensate characteristics variation of the bias voltage generator due to manufacturing parameter. This signal amplifier can adjust the offset voltage of the noninverting amplifier by the bias voltage generator. This eliminates the need for a clamp capacitor, thereby reducing the effect of capacitance on the operation speed and achieving high-speed operation. Further, since the characteristics of the noninverting amplifier are set so as to compensate variation in the characteristics of the bias voltage generator, it allows stable operation in spite of manufacturing variation.

According to another aspect of the present invention, there is provided a signal amplifier comprising a source follower circuit comprising a first drive transistor outputting an amplified signal according to an input signal and a load transistor as a load; an inverter circuit connected in series with the source follower circuit, the inverter circuit comprising a second drive transistor outputting an amplified signal according to an input signal; and a bias circuit generating a bias voltage for determining an offset voltage of the source follower circuit, the bias circuit comprising a first and a second voltage dividing transistors connected vertically, and outputting a bias voltage to the load transistor from an intermediate node of the first and the second voltage dividing transistors, wherein the second drive transistor and the first voltage dividing transistor have substantially the same characteristics. This signal amplifier can adjust the offset voltage of the source follower by the bias circuit. This eliminates the need for a clamp capacitor, thereby reducing the effect of capacitance on the operation speed and achieving high-speed operation. Further, since the drive transistor of the inverter and the voltage dividing transistor of the bias circuit have substantially the same characteristics, it allows stable operation in spite of manufacturing variation.

According to yet another aspect of the present invention, there is provided a signal amplifier comprising a source follower receiving an input signal; an inverter receiving an output signal of the source follower; and a push-pull circuit receiving the output signal of the source follower and an output signal of the inverter. This signal amplifier can amplify the output signal of the inverter with an appropriate gain according to the output signal of the source follower by the push-pull circuit. This allows increasing a gain even if the signal amplifier has transistors of the same characteristics, thereby effectively achieving high-speed operation.

The present invention provides a voltage amplifier capable of high-speed, high-frequency band operation, high gain, and stable operation in spite of variation in manufacture.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
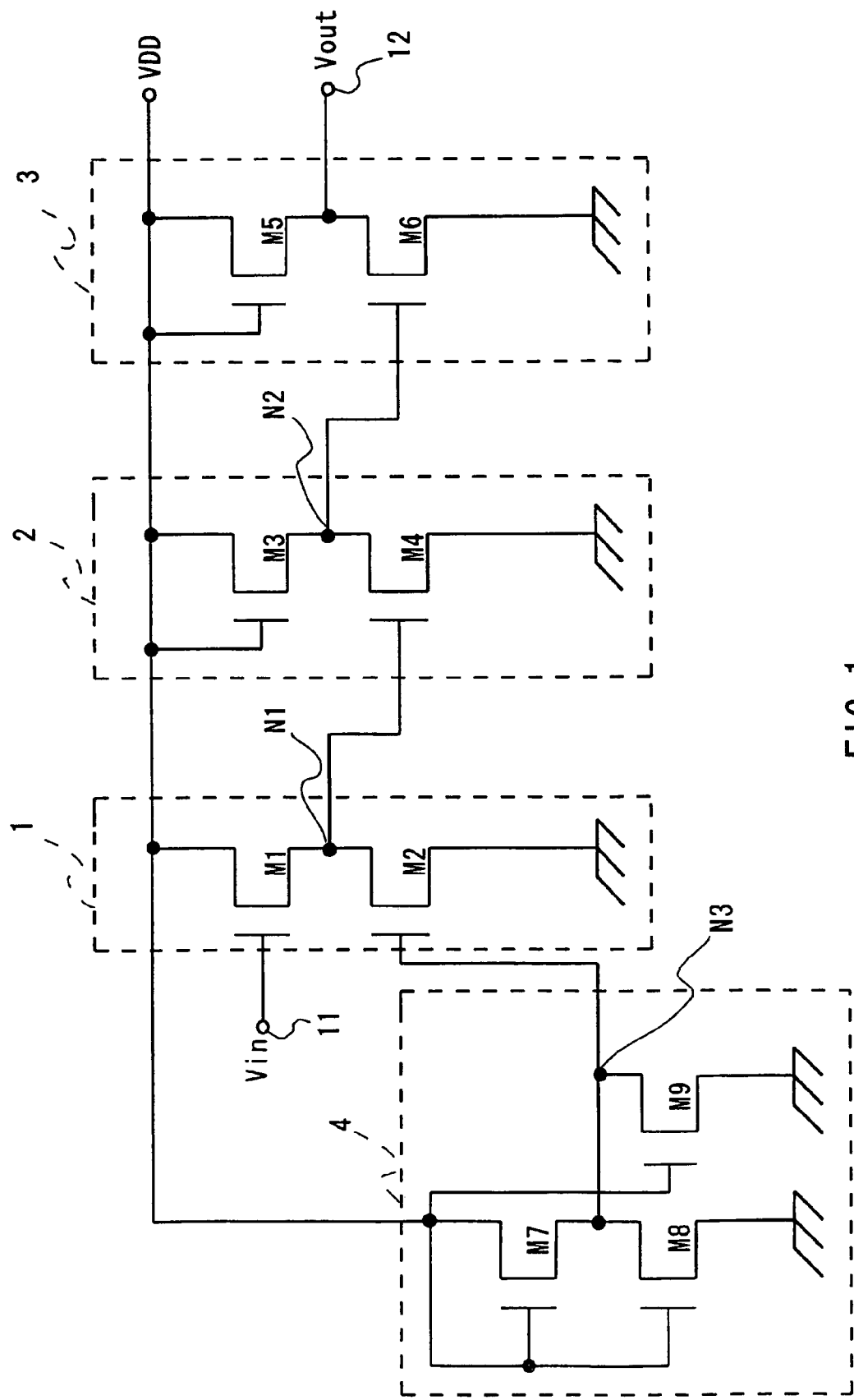
FIG. 1 is a circuit diagram showing the configuration of a voltage amplifier of the invention.

Referring first to FIG. 1, the configuration of a voltage amplifier (signal amplifier) according to a first embodiment of the present invention is described below. In FIG. 1, the same reference symbols as in FIG. 6 designate the same or similar elements. The voltage amplifier includes a source follower (noninverting amplifier) 1, the inverter 2, and the inverter 3 which are connected in series between the signal input terminal 11 and the signal output terminal 12, and a voltage divider 4 for supplying a gate voltage (bias voltage) to the load transistor of the source follower 1. A power supply voltage VDD is supplied to each device.

Figure 6:
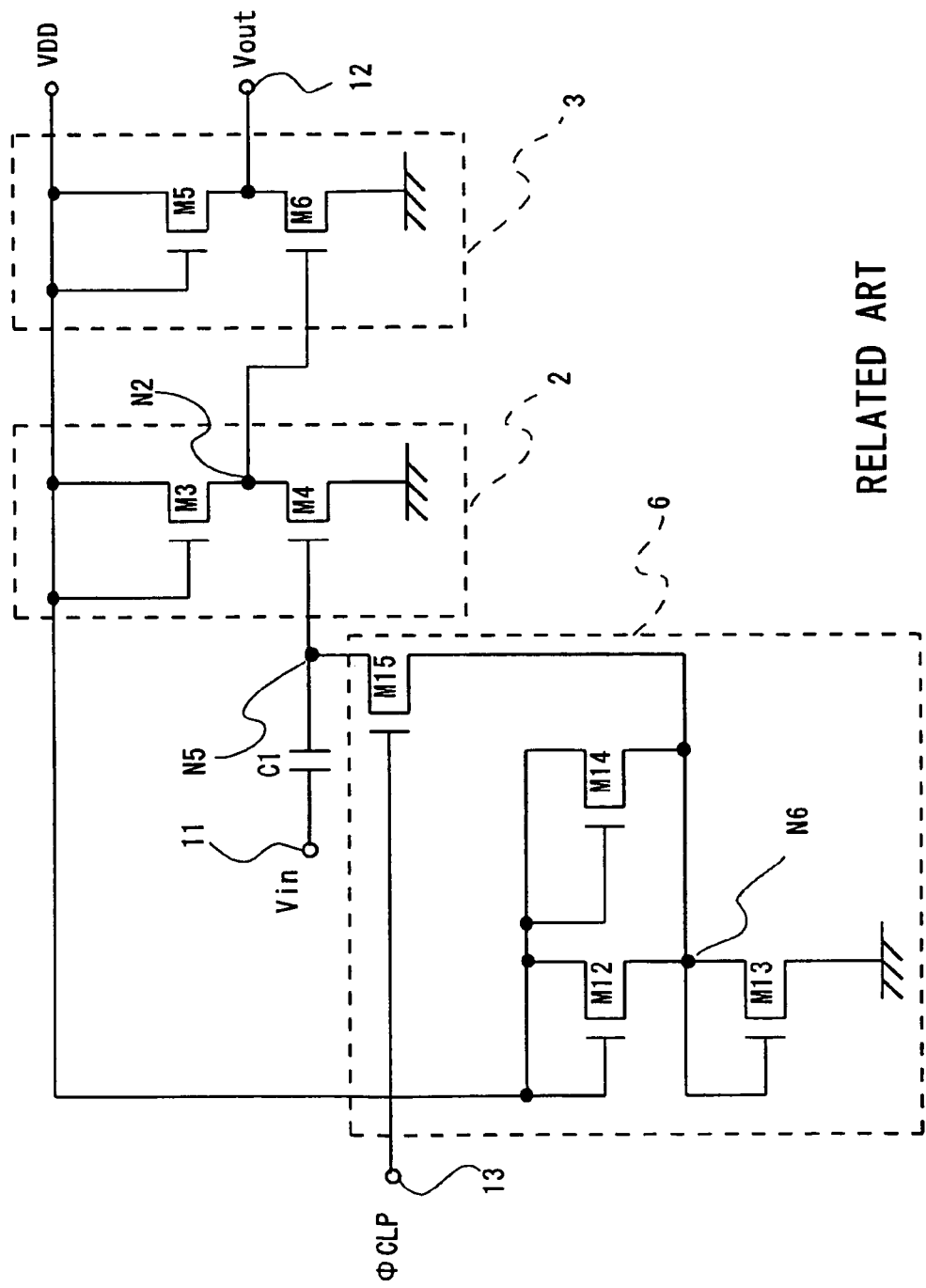
FIG. 6 is a circuit diagram showing the configuration of a conventional voltage amplifier.
Figure 7:
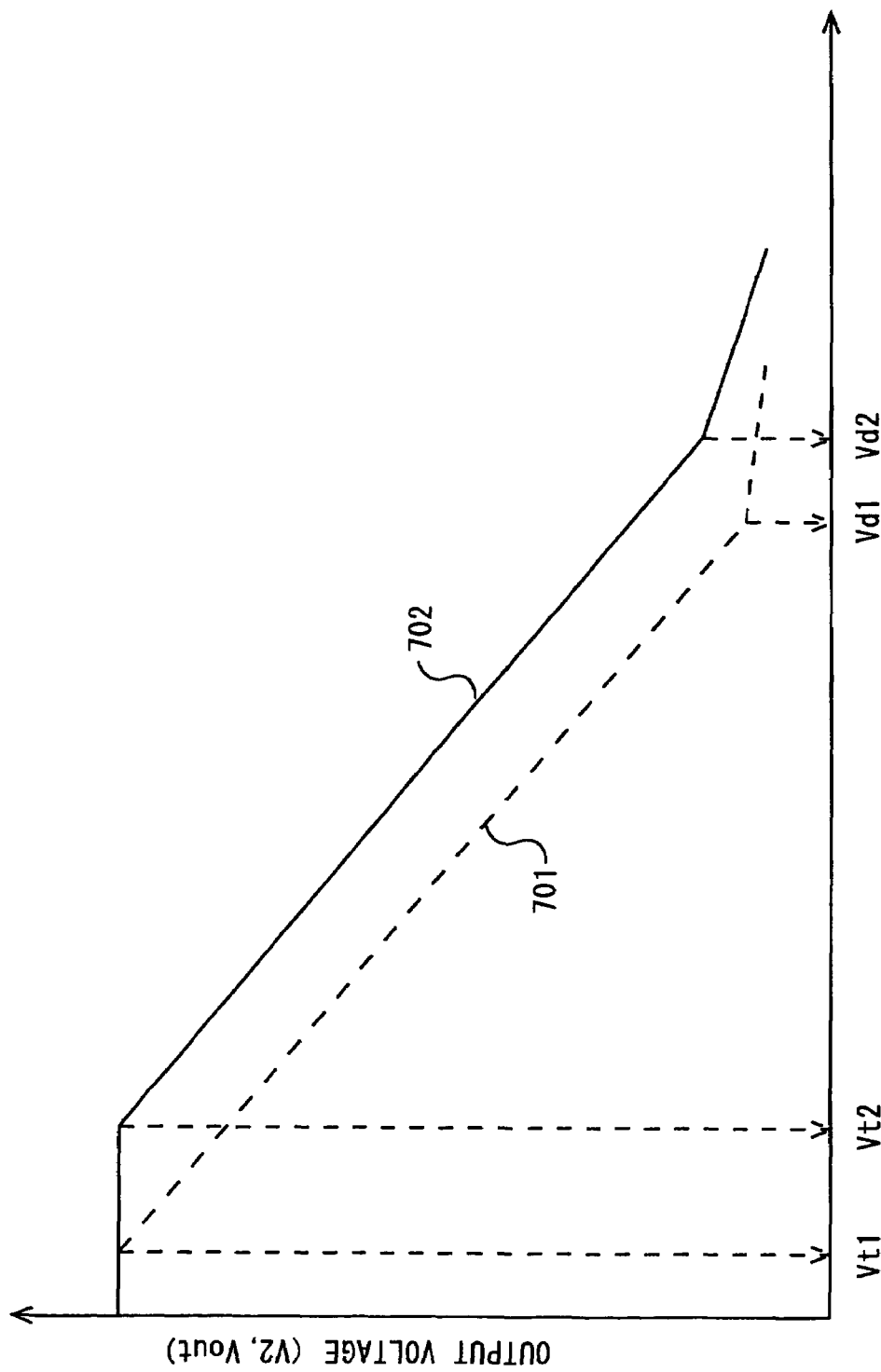
FIG. 7 is a graph showing the input and output characteristics of an inverter.

The inverter 3 has the same configuration as in FIG. 6. The source follower 1, the inverter 2, and the voltage divider 4 are described hereafter. The source follower 1 has transistors M1 and M2, which serve as a drive transistor and a load transistor, respectively. The transistor M1 has the drain connected to the power supply VDD, the gate connected to the signal input terminal 11, and the source connected to the node N1, which is the output terminal of the source follower 1. The transistor M2 has the drain connected to the node N1, the gate connected to the node N3, which is the output terminal of the voltage divider 4, and the source connected to the ground GND. The inverter 2 is the same as in FIG. 6 except that its input end is the node N1.

The voltage divider 4 is a bias voltage generator that generates a bias voltage for regulating an output offset voltage of the source follower 1, as described later. The voltage divider 4 supplies a voltage to the gate of the load transistor of the source follower 1. The voltage divider 4 has three transistors M7, M8, and M9 as voltage dividing transistors. The transistor M7 has the drain and the gate connected to the power supply VDD and the source connected to the N3, which is the output terminal (voltage dividing terminal) of the voltage divider 4. The transistors M8 and M9 each have the drain connected to the node N3, the gate connected to the power supply VDD, and the source connected to the ground GND.

In the power amplifier of FIG. 1, the transistors M1 and M2 of the source follower 1, the transistors M3 and M4 of the inverter 2, the transistor M5 of the inverter 3, and the transistors M7 and M8 of the voltage divider 4 have the same threshold voltage Vt1. The drive transistor M6 of the inverter 3 and the transistor M9 of the voltage divider 4 have the same threshold voltage Vt2. The two threshold voltages satisfy: Vt1<Vt2. Thus, the drive transistor M6 and the transistor M9 have the same characteristics. The characteristics of the inverter 3 (drive transistor M6) are set so as to compensate variation in the characteristics of the voltage divider 4 (transistor M9) due to manufacturing parameter.

The combination of the threshold voltages of the transistors described above is just an example, and an optimal combination may be used depending on gain, power supply voltage, and so on. A method for manufacturing a plurality of kinds of transistors having different threshold voltages, such as Vt1 and Vt2, on a semiconductor device is preferably changing ion implantation conditions when implanting ion to the part of a substrate to be a channel of the transistor, or changing threshold voltages by manufacturing parameter such as a formation time of a gate oxide film. It is not necessary to change the threshold voltage by the parameter of the layout size such as a gate length and a gate width.

Though the voltage divider 4 has two kinds of transistors having different threshold voltages only in the GND side when viewed from the voltage dividing terminal node N3, it may have other configurations depending on the direction or the degree of variation in the threshold voltage. For example, the voltage divider 4 may have one kind of transistor in the GND side and two kinds of transistors with different threshold voltages in the VDD side. Further, it may have one kind of transistor with the threshold voltage Vt2 in the GND side and one kind of transistor with the threshold voltage Vt1 in the VDD side. Furthermore, it may have two kinds of transistors with different threshold voltages both in the VDD side and the GND side; further, they may be divided. In addition, though the gates of the two transistors in the GND side of the voltage divider 4 when viewed from the voltage dividing terminal node N3 are connected to the power supply VDD, they may be connected to another given voltage or to the output terminal of the voltage divider.

The amplification operation of the voltage amplifier of FIG. 1 is described below. The input signal Vin from the signal input terminal 11 is input to the source follower 1. The source follower 1 is used as an output buffer or a level shifter. Keeping the input signal Vin noninverted, the source follower 1 outputs an output voltage V1 to the node N1, which is the input terminal of the inverter 2 in the next stage. The inverters 2 and 3 in the subsequent stages have the same structure as those of the related arts. They amplify the signal by the amplification operation shown in the graph of FIG. 8, and output the output signal Vout from the signal output terminal 12.

Since this example does not have a clamp circuit, the input offset voltage VCin of the input signal Vin is input to the voltage amplifier as it is. It is thus impossible to adjust the offset by the clamp voltage so as to input a signal properly in the amplification region in the inverter 3. Therefore, in this embodiment, the gate voltage of the load transistor M2 of the source follower 1 varies by the manufacturing condition of the transistor, thereby adjusting the offset voltage of the inverter 3 to enable the operation in the amplification region.

The principle of the offset adjustment of this embodiment is described below. The voltage divider 4 supplies a voltage to the gate of the load transistor M2 of the source follower 1, thereby adjusting the DC offset level of the source follower 1.

The voltage divider 4 have two kinds of transistors with two different threshold voltages, the transistor M8 with Vt1 and the transistor M9 with Vt2, in the ground GND side while having a single transistor M7 with the threshold voltage Vt1 in the power supply VDD side when viewed from the node N3 at the voltage dividing terminal.

If only the threshold voltage Vt2 of the transistor M9 varies due to manufacturing variation in the above configuration having the transistor M9 with the threshold voltage Vt2 only in the GND side from the voltage dividing terminal node N3, when the threshold voltage Vt2 becomes higher, only the voltage dividing resistance in the GND side decreases; accordingly, the divided voltage V3 at the node N3 becomes higher.

Figure 2:
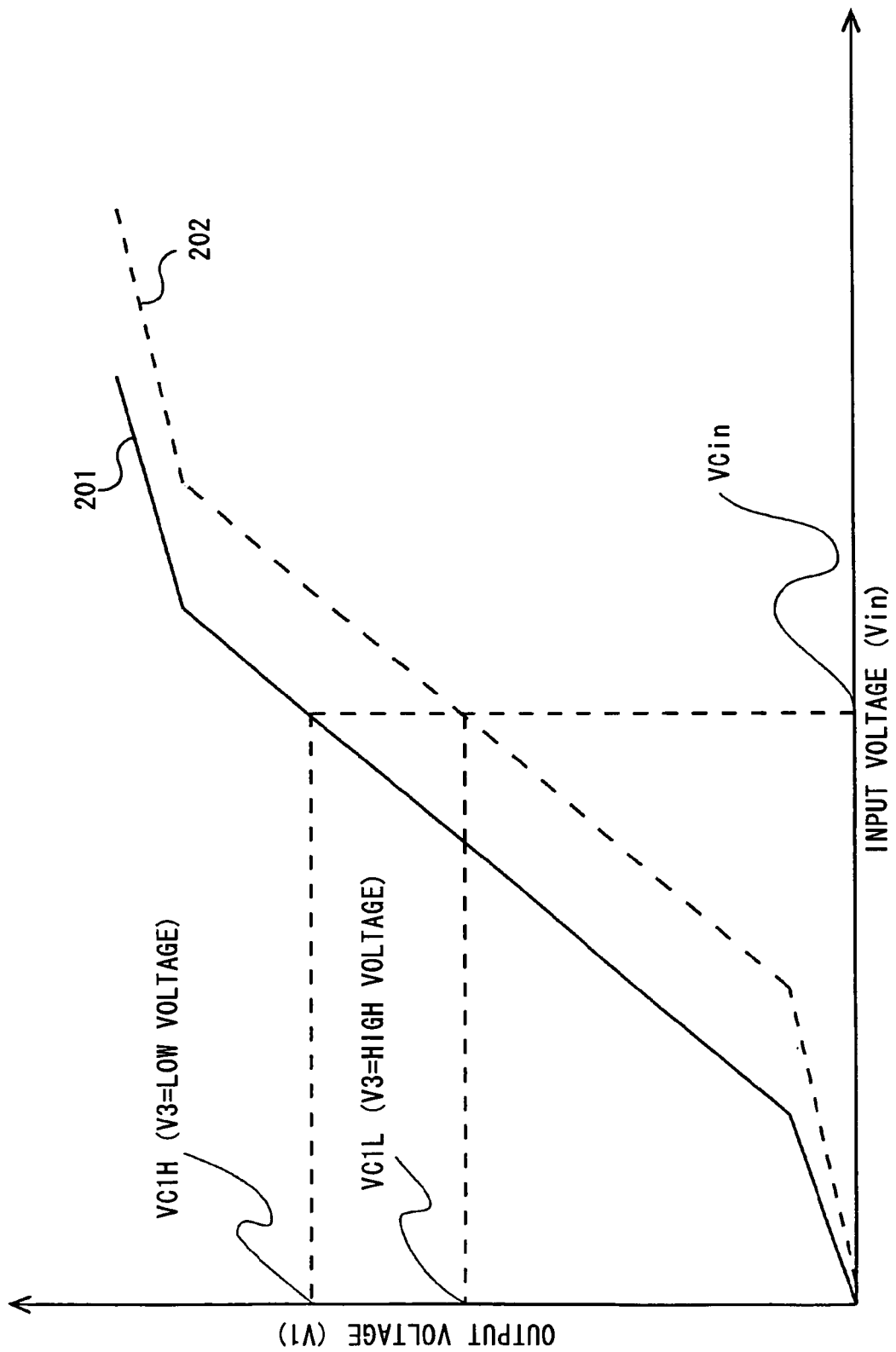
FIG. 2 is a graph showing the input and output characteristics of a source follower of the invention.

The characteristics variation of the source follower 1 upon occurrence of the voltage variation at the node N3 is described with reference to FIG. 2. FIG. 2 shows the input and output voltage characteristics of the source follower 1. In the graph of FIG. 2, the horizontal line indicates an input voltage and the vertical line indicates an output voltage. The solid line 201 and the dotted line 202 show the cases where the divided voltage V3 is low and high, respectively. If the offset voltage VCin input to the source follower 1 is constant, since the higher divided voltage V3 causes more current to flow into the load transistor of the source follower 1, the output voltage V1 of the source follower 1 becomes an offset voltage VC1L, which is lower than an offset voltage VC1H when the divided voltage V3 is low. Therefore, if the characteristics of the transistor M9 vary by manufacturing variation or the like, the divided voltage changes and the amplification region of the source follower 1 also varies accordingly.

Figure 3:
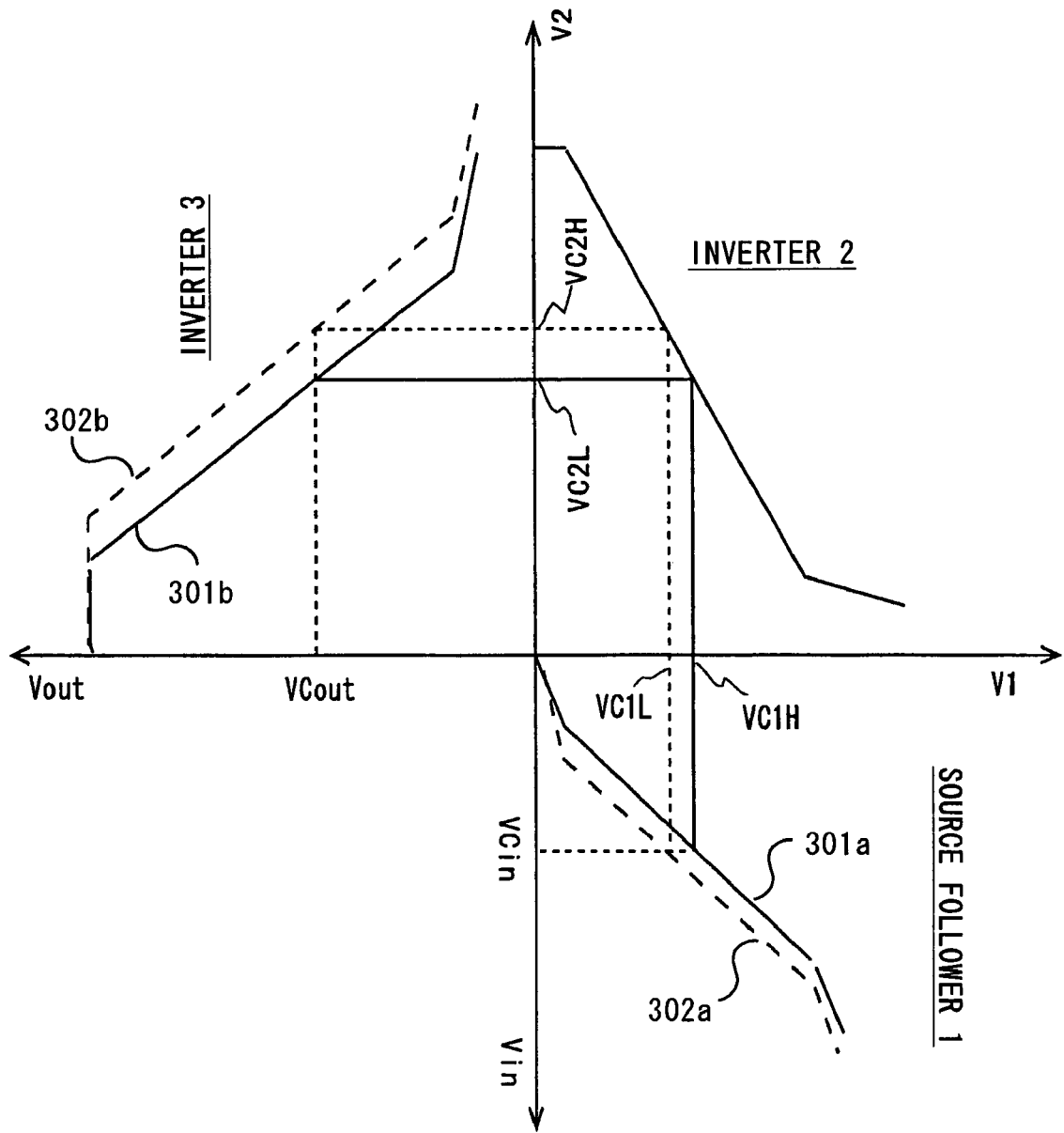
FIG. 3 is a graph showing the input and output characteristics of a plurality of amplifiers used in a voltage amplifier of the invention.

Referring then to FIG. 3, the offset variation where the transistor with the threshold voltage Vt2 varies due to manufacturing variation or the like with respect to the transistor with the threshold voltage Vt1 when the source follower 1, the inverters 2 and 3 are connected in series is described hereafter. As an example of the offset variation, the cases where the threshold voltage Vt2 is normal and where it is higher than normal are described. The fourth quadrant of the graph of FIG. 3 shows the input and output characteristics of the source follower 1, the first quadrant shows those of the inverter 2, and the second quadrant shows those of the inverter 3. In FIG. 3, the solid line 301 shows the characteristics when the threshold voltage Vt2 is normal, and the dotted line 302 shows the characteristics when the threshold voltage Vt2 is higher than normal due to manufacturing variation.

The characteristics in the fourth quadrant of the graph of FIG. 3 are the same as those in FIG. 2. If Vt2 is normal, the output offset voltage is VC1H as shown by the solid line 301a, and if Vt2 is higher than normal, the output offset voltage is VC1L as shown by the dotted line 302a. No characteristics variation occurs in the inverter 2 in the first quadrant since the inverter 2 only has the transistor with the threshold voltage Vt1. Thus, in the inverter 2, if the input offset voltage is VC1H, the output offset voltage is VC2L; on the other hand, if the input offset voltage is VC1L, the output offset voltage is VD2H. The offset voltages VC1H and VC1L are inverted and amplified in the output of the inverter 2. Thus, the inverter 2 outputs VC2L if Vt2 is normal, and outputs VC2H if Vt2 is higher than normal. In the inverter 3, if Vt2 is normal, VC2L is amplified as shown by the solid line 301b to generate the output offset voltage VCout; if Vt2 is higher than normal, VC2H is amplified as shown by the dotted line 302b to generate the output offset voltage VCout, which is the same as when Vt2 is normal.

However, the degree of variation in the output offset voltage of the inverter 3 caused by the variation in Vt due to manufacturing variation (manufacturing parameter) varies according to the gain of the inverters 2 and 3. Changing the gain of the inverter in design requires changing a difference in the output offset, which is a difference between VC1H and VC1L, in the source follower 1. Since the output of the source follower 1 is amplified by the inverter in the subsequent stage, it is necessary to decrease a difference between VC1H and VC1L if the gain of the inverter is high and increase the difference if the inverter gain is low. It is therefore necessary to change the degree of variation in the divided output voltage V3 of the voltage divider 4 with respect to the variation in Vt2. This allows changing a difference in the output offset in FIG. 2.

This embodiment places the transistors M8 and M9 having different threshold voltages Vt1 and Vt2 in the GND side from the voltage dividing node N3 of the voltage divider 4. It is thereby possible to change the ON-resistance ratio (gm ratio) of the transistors M8 and M9 to change the voltage variation ratio of the divided voltage V3 accompanying the variation in Vt2 by adjusting the gate length, gate width, and so on of the transistors. This enables adjustment of a difference between VC1H and VC1L, thereby allowing the output offset of the inverter 3 to be always stable even if the gain of the inverter changes.

Since the source follower is placed in the preceding stage of the inverter, it is possible to configure the voltage amplifier without including the clamp capacitor and the clamp circuit, which are required in the conventional techniques. This eliminates the parasitic capacitance of the clamp capacitor and the clamp circuit, thereby significantly reducing the input capacitance. This reduces the output load capacitance of the circuit in the preceding stage of the clamp, such as the source follower where the output terminal is the signal input terminal 11 of FIG. 1, thus increasing the speed of the circuit in the preceding stage of the clamp. It is thereby possible to increase the speed of the voltage amplifier such as CCD in total. Further, this configuration eliminates the need for a clamp control signal, thus simplifying the drive circuit.

In addition, since the clamp capacitor and the clamp circuit are not used and thus DC cutting is not made, it is possible to avoid a decrease in gain due to voltage dividing from the parasitic capacitance, thereby substantially increasing the gain of the voltage amplifier. Further, since the gate voltage of the load transistor of the source follower 1 is varied according to manufacturing variation, a signal is always in the amplification region in the inverter, thus allowing obtaining a stable output signal in spite of the manufacturing variation.

Second Embodiment

Figure 4:
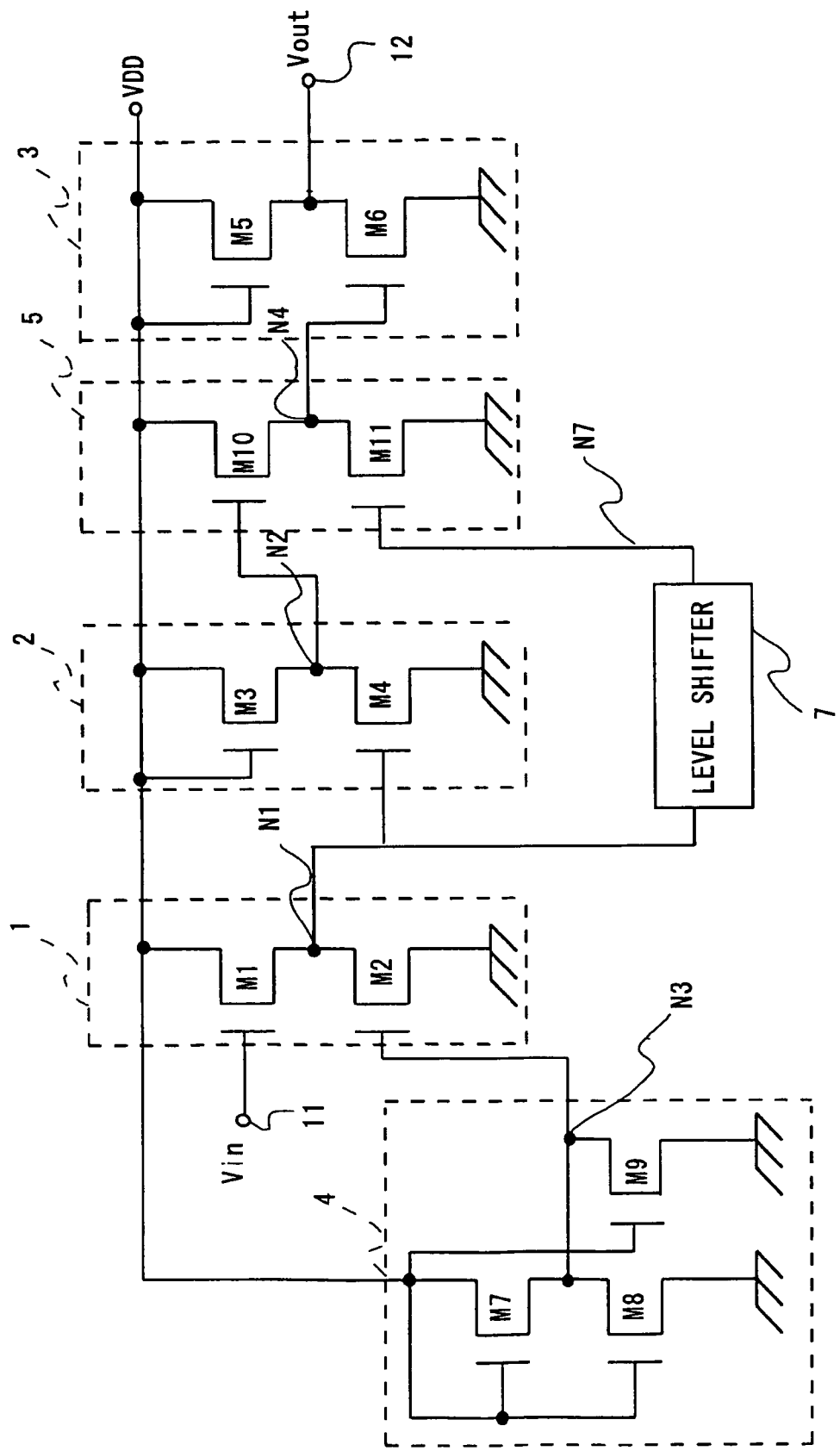
FIG. 4 is a circuit diagram showing the configuration of a voltage amplifier of the invention.

The configuration of a voltage amplifier according to a second embodiment of the present invention is described hereafter with reference to FIG. 4. In FIG. 4, the same reference symbols as in FIGS. 1 and 6 designate the same or similar elements. The voltage amplifier includes the source follower 1, the inverter 2, a noninverting amplifier 5, and the inverter 3 connected in series between the signal input terminal 11 and the signal output terminal 12, a level shifter 7 connected between the output terminal of the source follower 1 and the gate of the load transistor of the noninverting amplifier 5, and the voltage divider 4 supplying a voltage to the gate of the load transistor of the source follower 1. A power supply VDD is supplied to each device.

The source follower 1, the inverter 2, and the voltage divider 4 have the same configuration as those in FIG. 1. The noninverting amplifier 5, the level shifter 7, and the inverter 3 are described hereafter. The noninverting amplifier 5 has the same configuration as the source follower 1, and it has transistors M10 and M11, which serve as a drive transistor and a load transistor of a source follower, respectively. The transistor M10 has the drain connected to the power supply VDD, the gate connected to the node N2, which is the output terminal of the inverter 2, and the source connected to a node N4, which is the output terminal of the noninverting amplifier 5. The transistor M11 has the drain connected to the node N4, the gate connected to a node N7, which is the output terminal of the level shifter 7, and the source connected to the ground GND.

The level shifter 7 is a noninverting output buffer including a source follower and so on, for example, though it may have any configuration. The input terminal of the level shifter 7 is connected to the node N1, which is the output terminal of the source follower 1, and the output terminal of the level shifter 7 is the node N7. The inverter 3 has the same configuration as in FIG. 1 except that the input terminal is connected to the node N4, which is the output terminal of the noninverting amplifier 5.

Though this embodiment uses the level shifter 7, which is normally a noninverting buffer including a source follower and so on, it is not limited thereto as long as the output signal from the source follower 1 is input, kept noninverted, to the gate of the transistor M11 of the noninverting amplifier 5. The level shifter 7 may be thus eliminated depending on the input and output operation region of the noninverting amplifier 5. Thus, the node N1 may be directly connected to the gate of the transistor M11. However, it is preferred to use the level shifter as a buffer for preventing a decrease in speed and as a level shifter for matching the input and output operation region of the noninverting amplifier 5. In the circuit of FIG. 4, all the transistors including the transistor constituting the level shifter 7 have the same threshold voltage. It is, however, possible to use a plurality of kinds of transistors having different threshold voltages according to need.

This embodiment places the noninverting amplifier 5 between the inverters 2 and 3, which are directly connected in series in FIG. 1, and inputs the output of the source follower 1 to the gate of the transistor M11 of the noninverting amplifier 5 through the level shifter 7. Usually, use of the noninverting amplifier 5 merely as a source follower where a load transistor receives a DC voltage causes a decrease in the gain of the voltage amplifier as a whole since the voltage gain of the source follower is generally about 0.7 to 0.9. To avoid this, this embodiment inputs the signal before being inverted by the inverter 2, which is the output signal of the source follower 1, to the load transistor M11 through the level shifter 7, thereby driving the source follower of the noninverting amplifier 5 as a push-pull amplifier. This increases the voltage gain of the noninverting amplifier 5 to about 1 to 1.5, thus preventing a gain decrease due to the source follower and even allowing a gain increase. As a result, this voltage amplifier has a higher gain than the voltage amplifier of FIG. 1. If the gain can be low, the level shifter 7 maybe eliminated and the voltage amplifier may have a mere source follower.

Figure 8:
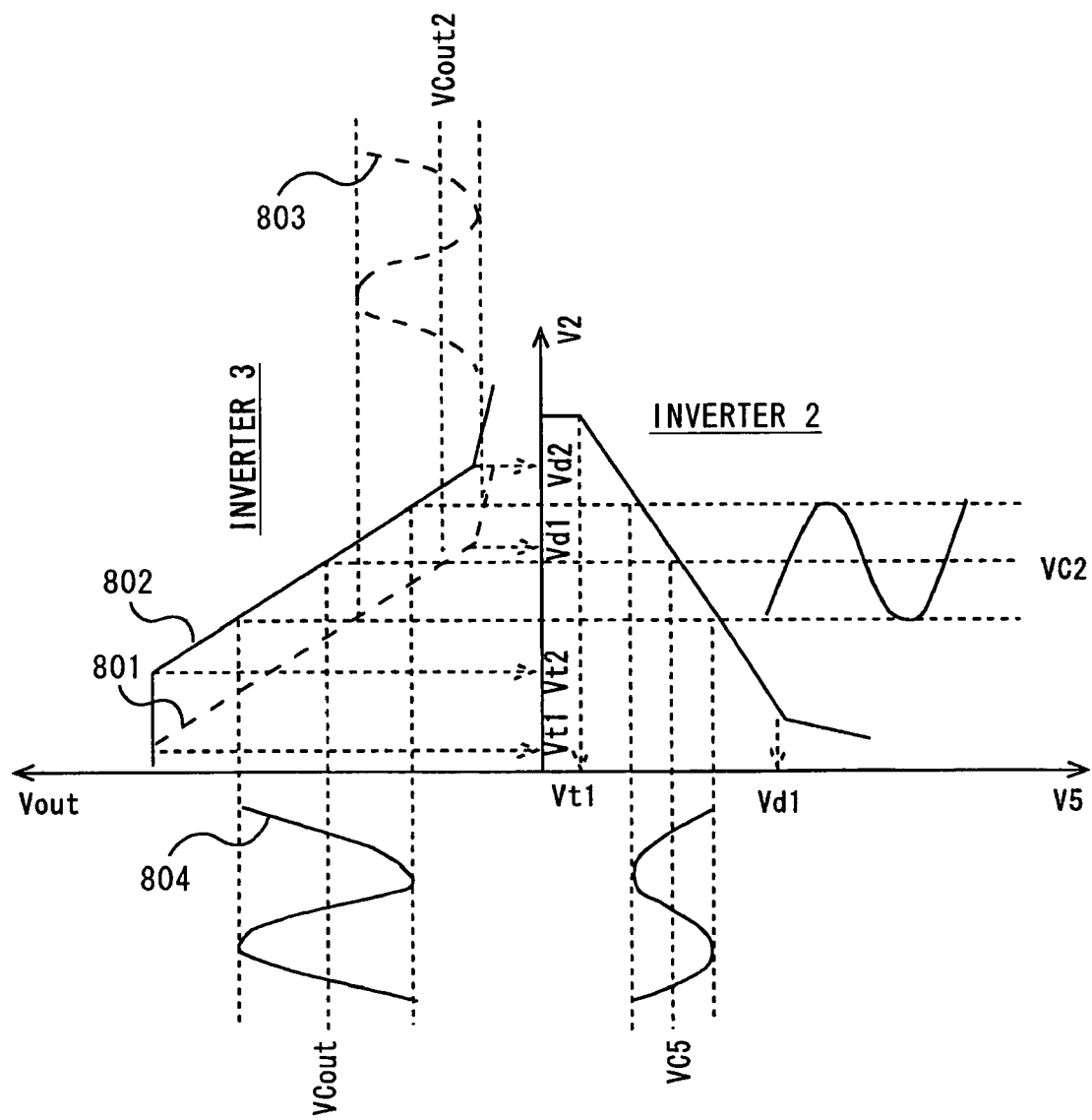
FIG. 8 is a graph showing the input and output characteristics of a plurality of amplifiers used in a conventional voltage amplifier.

Further, the amplifiers of FIGS. 1 and 6 set the threshold voltage of the drive transistor M6 of the inverter 3 to be higher than the transistor of the inverter 2 in order to adjust the amplification region as described in FIGS. 3 and 8, thus requiring two kinds of transistors having two different threshold voltages. This embodiment, on the other hand, eliminates the need for using a plurality of kinds of transistor having different threshold voltages by adding the noninverting amplifier 5 between the inverters 2 and 3. It is thereby possible to constitute the voltage amplifier with transistors having the same threshold voltage. The voltage amplifier may include transistors with different threshold voltages.

Figure 5:
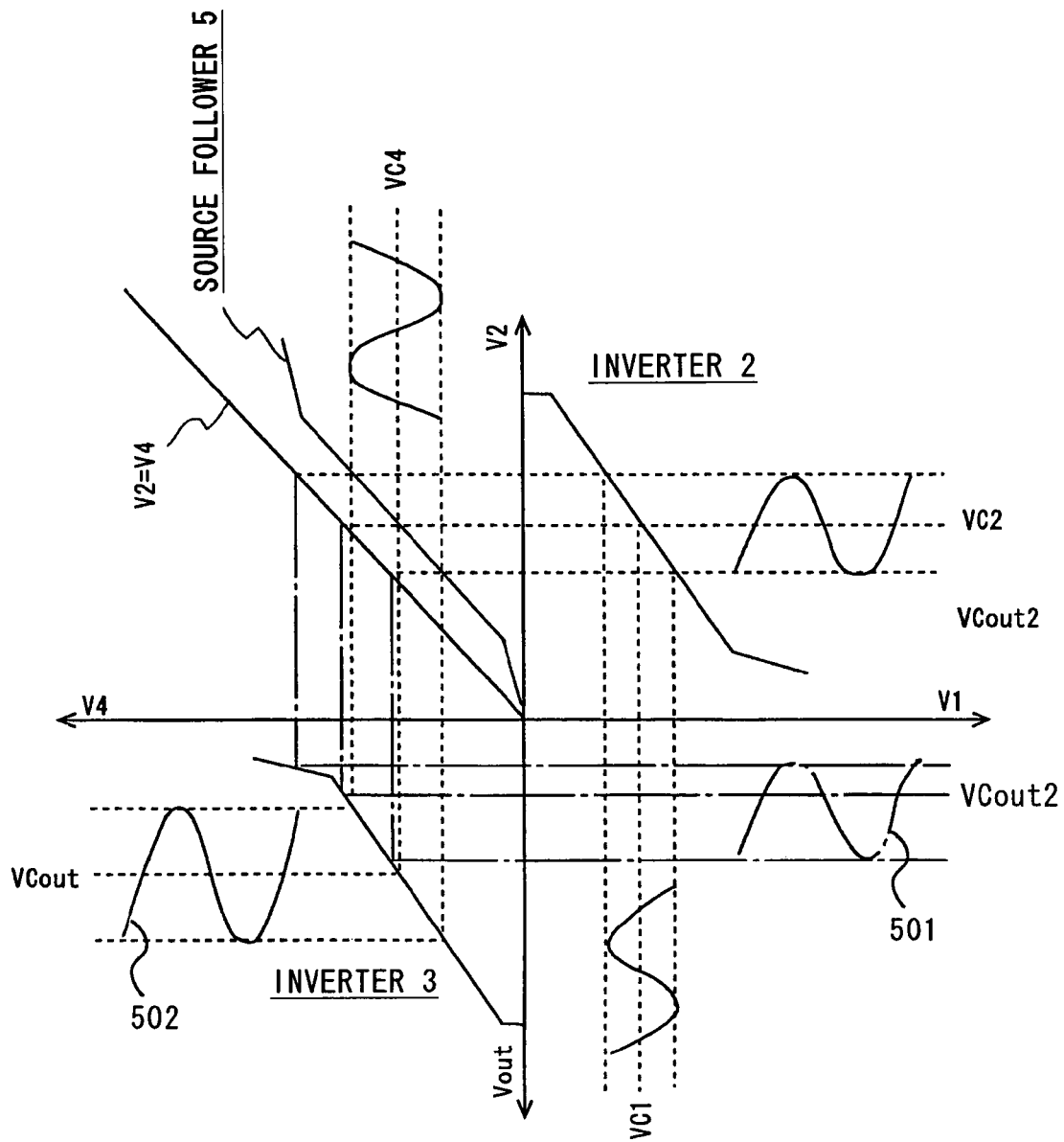
FIG. 5 is a graph showing the input and output characteristics of a plurality of amplifiers used in a voltage amplifier of the invention.

The input and output characteristics of the circuits in the subsequent stages of the source follower 1 are described with reference to FIG. 5. In FIG. 5, the first, second and third quadrants show the input and output characteristics of the inverter 2, the noninverting amplifier 5, and the inverter 3, respectively. In the first quadrant, the output signal (offset voltage VC1) of the source follower 1 is input so as to be center of the amplification region of the inverter 3. This signal is inverted and amplified by the inverter 2, and the output voltage V2 (output offset voltage VC2) is transmitted to the noninverting amplifier 5.

If the noninverting amplifier 5 is not placed and the threshold voltage of the drive transistor M6 of the inverter 3 is not set high, the input voltage V4 of the inverter 3 equals V2 (V4=V2), and the output signal Vout (offset voltage VCout2) of the inverter 3 has a distorted waveform off the amplification region as shown by the alternate long and short dash line 501 of FIG. 5. On the other hand, the case of placing the noninverting amplifier 5 between the inverters 2 and 3 is as follows. The noninverting amplifier 5 allows reducing the output offset voltage VC4 by increasing the gate voltage of the load transistor M11 as shown in FIG. 2; therefore, it is possible to adjust the output offset voltage VC7 of the level shifter 7 in such a way that the output signal V4 of the noninverting amplifier 5 is within the amplification region of the inverter 3. This allows the output Vout of the inverter 3, shown by the solid line 502, to be properly inverted and amplified without distortion, and the output offset voltage is VCout.

Since this embodiment allows adjustment of the amplification region by use of the noninverting amplifier 5, there is no need to use transistors having different threshold voltages. This eliminates the need for an additional semiconductor manufacturing step such as ion implantation in order to manufacture the transistors with different characteristics, thereby reducing the manufacturing process. It is thereby possible to improve manufacturing efficiency and reduce manufacturing costs. Further, since this embodiment eliminates manufacturing variation in a threshold voltage or the like by transistor type, it is possible to increase yield and facilitate design. Furthermore, this embodiment can increase the gain by driving the noninverting amplifier 5 as a push-pull amplifier. This embodiment can also increase the speed of the voltage amplifier if the noninverting amplifier 5 also functions as a buffer by applying sufficient voltages so as to suppress a decrease in the speed of the inverter 2 in the previous stage.

Other Embodiments

Though the above embodiments describe the cases where the drive transistor M6 of the inverter 3 and the transistor M9 of the voltage divider 4 have the same threshold voltage, it is not limited thereto. The drive transistor M4 of the inverter 2 and the transistor M7 of the voltage divider 4 may have the same threshold voltage.

Though two inverters are placed in the above embodiments, one or an arbitrary number of inverters may be placed. If the inverter is one, however, the inverted signal is output.

Though the transistors in the voltage amplifier are NMOS transistors in the above embodiments, they may be PMOS transistors of enhancement or depression type. If PMOS transistors are used, the power supply VDD and the ground GND are opposite.

As described in the foregoing, the present invention increases the speed and the luminous sensitivity (signal gain) of the voltage signal amplifier included in a solid-state imaging apparatus such as CCD, thereby reducing an imaging time. The voltage gain increase allows processing of minute signals. Further, since the circuit configuration is stable in spite of manufacturing variation, it is possible to stably drive and manufacture a semiconductor device having the above effects. Further, since this reduces the semiconductor process such as ion implantation, it is possible to reduce the manufacturing costs.

It is apparent that the present invention is not limited to the above embodiment that may be modified and changed without departing from the scope and spirit of the invention.

What is claimed is:

1. A signal amplifier comprising:
   a source follower circuit comprising a first drive transistor outputting an amplified signal according to an input signal and a load transistor as a load;
   an inverter circuit connected in series with the source follower circuit, the inverter circuit comprising a second drive transistor outputting an amplified signal according to an input signal; and
   a bias circuit generating a bias voltage for determining an offset voltage of the source follower circuit, the bias circuit comprising a first and a second voltage dividing transistors connected vertically and outputting a bias voltage to the load transistor from an intermediate node of the first and the second voltage dividing transistors,
   wherein the second drive transistor and the first voltage dividing transistor have substantially the same characteristics.

2. The signal amplifier of claim 1, wherein
   the first voltage dividing transistor has a higher threshold voltage than the second voltage dividing transistor; and
   the second drive transistor and the first voltage dividing transistor have substantially the same threshold voltage.

3. The signal amplifier of claim 1, wherein
   the first drive transistor has a drain connected to a first potential, a gate connected to an input node, and a source connected to an output node, and
   the load transistor has a drain connected to the output node, a gate receiving a bias voltage generated by the bias circuit, and a source connected to a second potential.

4. The signal amplifier of claim 1, wherein
   the inverter circuit further comprises a load transistor as a load, and
   the second drive transistor has a higher threshold voltage than the load transistor of the inverter circuit.

5. The signal amplifier of claim 4, wherein the first drive transistor, the load transistor of the source follower circuit, the load transistor of the inverter circuit, and the second voltage dividing transistor have the same threshold voltage.

6. The signal amplifier of claim 1, further comprising a push-pull circuit receiving an output signal of the inverter circuit and an output signal of the source follower circuit.

7. The signal amplifier of claim 6, wherein the push-pull circuit comprises a noninverting amplifier circuit amplifying the output signal of the inverter circuit, with the output signal of the source follower circuit as a bias voltage.

8. The signal amplifier of claim 7, further comprising a level shifter circuit shifting a level of the output signal of the source follower circuit and outputting the level-shifted signal as a bias voltage to the noninverting amplifier circuit.

9. A signal amplifier comprising:
   a source follower receiving an input signal;
   an inverter receiving an output signal of the source follower;
   a push-pull circuit receiving the output signal of the source follower and an output signal of the inverter; and
   a level shifter receiving an output signal of the source follower, wherein the output signal of the source follower is input to the push-pull circuit through the level-shifter.

10. A signal amplifier comprising:
    a source follower receiving an input signal;
    an inverter receiving an output signal of the source follower; and
    a push-pull circuit receiving the output signal of the source follower and an output signal of the inverter,
    wherein the push-pull circuit has a first and a second transistor connected vertically,
    an output signal of the inverter is input to a gate of the first transistor, and
    an output signal of the source follower is input to a gate of the second transistor.

* * * * *